United States Patent
Walker et al.

(10) Patent No.: US 12,050,381 B2
(45) Date of Patent: Jul. 30, 2024

(54) COLOR CONVERSION FILM FOR BACKLIGHT UNIT

(71) Applicant: BrightView Technologies, Inc., Durham, NC (US)

(72) Inventors: Kenneth L. Walker, Durham, NC (US); Juhyun J. Lee, Durham, NC (US)

(73) Assignee: BrightView Technologies, Inc., Durham, NC (US)

(*) Notice: Subject to any disclaimer, the term of this patent is extended or adjusted under 35 U.S.C. 154(b) by 0 days.

(21) Appl. No.: 17/980,661

(22) Filed: Nov. 4, 2022

(65) Prior Publication Data

US 2023/0061049 A1 Mar. 2, 2023

Related U.S. Application Data

(63) Continuation of application No. 17/418,825, filed as application No. PCT/US2019/068695 on Dec. 27, 2019.
(Continued)

(51) Int. Cl.
*G02F 1/00* (2006.01)
*G02F 1/1335* (2006.01)
(Continued)

(52) U.S. Cl.
CPC .. *G02F 1/133603* (2013.01); *G02F 1/133606* (2013.01); *G02F 1/133614* (2021.01); *H01L 33/502* (2013.01)

(58) Field of Classification Search
CPC ......... G02F 1/133603; G02F 1/133606; G02F 1/133607; G02F 1/133614
See application file for complete search history.

(56) References Cited

U.S. PATENT DOCUMENTS

| 7,072,096 B2 | 7/2006 | Holman et al. |
| 7,190,387 B2 | 3/2007 | Rinehart et al. |

(Continued)

FOREIGN PATENT DOCUMENTS

| CN | 107966856 A | 4/2018 |
| CN | 109188772 A | 1/2019 |

(Continued)

OTHER PUBLICATIONS

International Search Report and Written Opinion received for PCT Patent Application No. PCT/US2019/068695, mailed on Mar. 10, 2020, 8 pages.

(Continued)

*Primary Examiner* — Gerald J Sufleta, II
(74) *Attorney, Agent, or Firm* — Rauschenbach Patent Law Group, PLLC; Kurt Rauschenbach

(57) ABSTRACT

A color conversion film for a backlight unit comprising an array of light emitting diodes includes a substantially planar base portion configured to receive light from a light source positioned below the substantially planar base portion. A plurality of three-dimensional structures are configured to extend from the substantially planar base portion in a direction away from the light source, where each of the plurality of three-dimensional structures having at least one sloped surface at an angle $\Theta$ relative to the substantially planar base portion such that each of the plurality of three-dimensional structures comprises a decreasing cross-section as light travels away from the light source.

15 Claims, 4 Drawing Sheets

Related U.S. Application Data

(60) Provisional application No. 62/787,828, filed on Jan. 3, 2019.

(51) Int. Cl.
*G02F 1/13357* (2006.01)
*H01L 33/50* (2010.01)

(56) References Cited

U.S. PATENT DOCUMENTS

| | | | |
|---|---|---|---|
| 7,192,692 | B2 | 3/2007 | Wood et al. |
| 7,525,126 | B2 | 4/2009 | Leatherdale et al. |
| 7,628,514 | B2 | 12/2009 | Hsu et al. |
| 7,645,058 | B2 | 1/2010 | Kurokawa et al. |
| 7,845,826 | B2 | 12/2010 | Aylward et al. |
| 7,867,695 | B2 | 1/2011 | Freese et al. |
| 7,959,324 | B2 | 6/2011 | Hsu |
| 7,969,085 | B2 | 6/2011 | Cok |
| 8,134,657 | B2 | 3/2012 | Nakagome et al. |
| 9,341,754 | B2 | 5/2016 | Maekawa et al. |
| 9,431,632 | B2 | 8/2016 | Inoue et al. |
| 9,513,426 | B2 | 12/2016 | Hong et al. |
| 9,817,178 | B2 | 11/2017 | Fan |
| 11,360,350 | B2 | 1/2022 | Tsai et al. |
| 11,520,182 | B2 | 12/2022 | Walker et al. |
| 2006/0163988 | A1 | 7/2006 | Kang et al. |
| 2007/0284565 | A1 | 12/2007 | Leatherdale et al. |
| 2008/0042552 | A1 | 2/2008 | Cok |
| 2008/0094831 | A1 | 4/2008 | Matsumoto |
| 2008/0297699 | A1* | 12/2008 | Shimazaki ............ G02B 5/045 349/67 |
| 2009/0262428 | A1 | 10/2009 | Kurokawa |
| 2009/0290218 | A1* | 11/2009 | Parker ............... G02F 1/133615 359/580 |
| 2010/0271840 | A1* | 10/2010 | Hamada ............... G02B 5/0247 362/609 |
| 2010/0328575 | A1 | 12/2010 | Shinkai et al. |
| 2012/0127397 | A1* | 5/2012 | Yamamoto ........... G02B 6/0065 29/428 |
| 2012/0176772 | A1* | 7/2012 | Maekawa ............ G02B 5/0231 362/327 |
| 2014/0168576 | A1* | 6/2014 | Lee ................... G02F 1/133603 349/71 |
| 2014/0362556 | A1 | 12/2014 | Cho et al. |
| 2016/0097889 | A1 | 4/2016 | Kim et al. |
| 2016/0116663 | A1 | 4/2016 | Hong et al. |
| 2017/0075052 | A1 | 3/2017 | Saitoh et al. |
| 2017/0097448 | A1 | 4/2017 | Wang et al. |
| 2017/0123139 | A1 | 5/2017 | Huang et al. |
| 2019/0196270 | A1* | 6/2019 | Hori ................. G02F 1/133611 |
| 2019/0227382 | A1 | 7/2019 | Watanabe et al. |
| 2020/0176650 | A1 | 6/2020 | Achi et al. |
| 2020/0249529 | A1 | 8/2020 | Yamada et al. |
| 2020/0341183 | A1 | 10/2020 | Yonemoto et al. |
| 2021/0262621 | A1 | 8/2021 | Eom |
| 2022/0075229 | A1 | 3/2022 | Walker et al. |

FOREIGN PATENT DOCUMENTS

| | | |
|---|---|---|
| CN | 113260815 A | 8/2021 |
| JP | 2005-241919 A | 9/2005 |
| JP | 2009-086031 A | 4/2009 |
| JP | 2009-265616 A | 11/2009 |
| JP | 2010-044378 A | 2/2010 |
| JP | 2011-076115 A | 4/2011 |
| JP | 2011-123379 A | 6/2011 |
| JP | 2011-243518 A | 12/2011 |
| JP | 2012-094266 A | 5/2012 |
| JP | 2012-114003 A | 6/2012 |
| JP | 2012-234047 A | 11/2012 |
| JP | 2012-242764 A | 12/2012 |
| JP | 2013-030404 A | 2/2013 |
| JP | 5167993 B2 | 3/2013 |
| KR | 10-2003-0080764 A | 10/2003 |
| WO | 2003/056876 A2 | 7/2003 |
| WO | 2006/073916 A1 | 7/2006 |
| WO | 2006/121690 A1 | 11/2006 |
| WO | 2012/015013 A1 | 2/2012 |
| WO | 2018/155304 A1 | 8/2018 |
| WO | 2020/142362 A1 | 7/2020 |

OTHER PUBLICATIONS

International Preliminary Report on Patentability received for PCT Patent Application No. PCT/US2019/068695, mailed on Jul. 15, 2021, 7 pages.

Non-Final Office Action received for U.S. Appl. No. 17/418,825, mailed on Feb. 3, 2022, 8 pages.

Notice of Allowance received for U.S. Appl. No. 17/418,825, mailed on Aug. 10, 2022, 10 pages.

Corrected Notice of Allowability received for U.S. Appl. No. 17/418,825, mailed on Sep. 15, 2022, 2 pages.

Chang et al., "Fabrication and optical design of a pyramid microstructure for the base of a light guide used in backlight module" Journal of Micro/Nanolithography, MEMS, and MOEMS, vol. 9, Issue 4, Oct. 2010, Retrieved from: <<https://doi.org/10.1117/1.3517108>>, pp. 043006-0-043006-9.

Chien et al., "Fabrication of integrated light guiding plate for backlight system", Proceedings, vol. 6109, Micromachining and Microfabrication Process Technology XI, Retrived from <<https://doi.org/10.1117/12.647115>>, Jan. 23, 2006, pp. 610909-1-610909-8.

Office Action received for Chinese Patent Application No. 201980087629.5, mailed on Dec. 28, 2022, 14 pages including 8 pages of English Translation.

Second Office Action received for corresponding Chinese Patent Application No. 201980087629.5, mailed on Aug. 30, 2023, 9 pages including 5 pages of English Translation.

\* cited by examiner

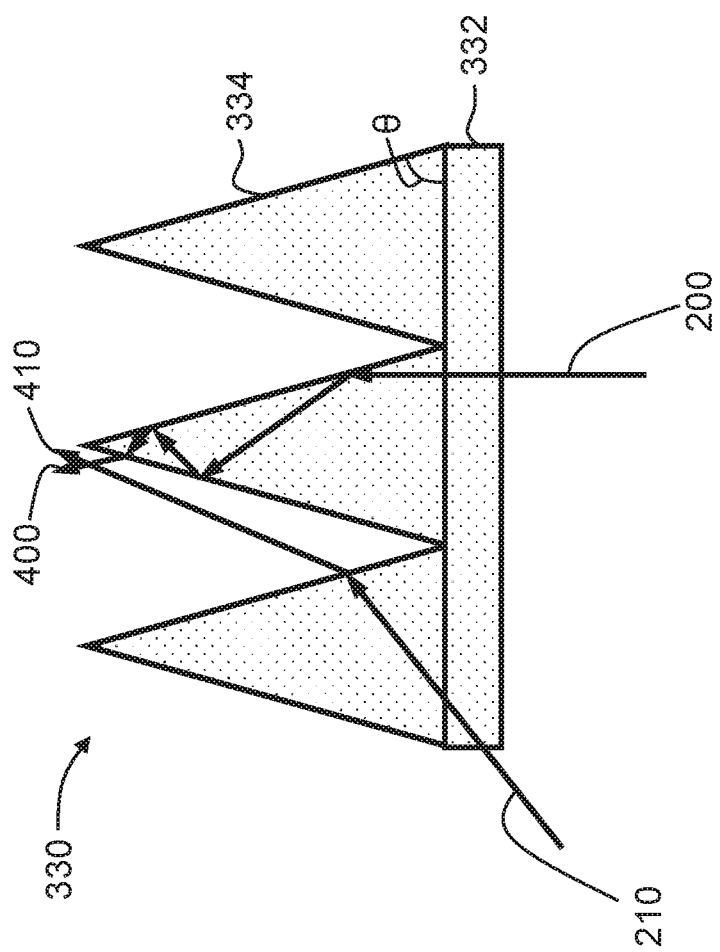

COLOR CONVERSION FILM FOR BACKLIGHT UNIT

CROSS REFERENCE TO RELATED APPLICATIONS

The present application is a continuation application of U.S. patent application Ser. No. 17/418,825, entitled "Color Conversion Film Back Light Unit for Backlit Displays", filed on Jun. 27, 2021, which is a National Stage Entry into the United States Patent and Trademark Office from International Patent Application No. PCT/US2019/068695, having an international filing date of Dec. 27, 2019, and which relies for priority on U.S. Provisional Patent Application Ser. No. 62/787,828, entitled "Color Conversion Film and Back Light Unit for Backlit Displays," filed Jan. 3, 2019. The content of all of these applications are hereby incorporated by reference in their entirety.

FIELD

The present invention is generally related to a color conversion film that may be used as a color conversion layer in a back light unit of a backlit display, particularly for backlit displays with blue light emitting diode (LED) light sources.

BACKGROUND

Liquid crystal displays (LCDs) are increasingly using a back light unit architecture 100 (schematically illustrated in FIG. 1) that typically consists of an array of individual short wavelength (blue) LEDs 110. As illustrated in FIG. 1, a series of films is used to spread or diffuse the light emitted from the blue LEDs 110, including a diffuser film 120, a color conversion layer 130 that uses either quantum dots or phosphor material to convert some of the blue light to green and red light, and may be in the form of a film, a second diffuser film 140 configured to spread or diffuse the light exiting the color conversion layer 130, and two brightness enhancing films (BEFs) 150, 160, which are often two prism films rotated approximately 90 degrees relative to each other. There may be additional films in the back light unit that are used to improve the overall uniformity of the light.

The use of a remote color conversion layer, such as the color conversion layer 130 depicted in FIG. 1, moves the blue-to-white-light converting material away from the LED itself to a substrate that is located a short distance from the LED. This has many potential benefits in terms of improved efficiency, improved reliability, and better uniformity of brightness and color reproduction. The color conversion layer is typically encapsulated within or between other plastic layers.

Within the color conversion layer 130, a substantial amount of the blue light is absorbed and re-emitted at longer wavelengths (for example, red and green wavelengths). The longer wavelengths of light are emitted in all directions and a significant portion stays in the layer 130 if there is no mechanism to allow the longer wavelengths of light to couple (i.e., exit) out of the film. Because of this, current color conversion layers may use surface roughness and/or scattering sites within the layers to allow the emitted light to couple out of the layer.

As illustrated in FIG. 2, when the color conversion layer 130 is a known phosphor or quantum dot-containing film 230, the light rays that enter the film do not travel the same distances within the film 230. For example, the light rays that enter the film 230 at a "high" angle, such as at normal (~90°), as represented by arrows 200, travel the shortest distance, and the light rays that enter the film 230 at "lower" angles, as represented by arrows 210, travel a longer distance than the light rays 200, as shown in FIG. 2. This difference in travel distance creates at least two issues.

First, the blue light that is traveling through the color conversion layer 130 at lower angles (arrows 210) travels longer distances through the color conversion layer 130 resulting in more of the blue light getting absorbed, as compared to the light traveling at higher angles (arrows 200), and thus less blue light exits the color conversion layer 130 at lower angles, which results in a color variation as a function of angle.

Second, because the low angle blue light (arrows 210) is preferentially attenuated relative to the normal blue light (arrows 200) the spreading or diffusion of the blue light is reduced. This results in poorer uniformity of the blue light, which necessitates thicker film stacks in the back light unit 100 to compensate.

It is desirable to have a color conversion layer that does not have angular dependence on the incoming light and can provide similar absorptions for light coming into the color conversion layer at different angles.

SUMMARY

According to an embodiment of the invention, there is provided a color conversion film for a backlight unit comprising an array of light emitting diodes. The color conversion film includes a substantially planar base portion, and a plurality of three-dimensional structures extending from the substantially planar base portion. Each of the plurality of three-dimensional structures has at least one sloped surface with a base angle of about 55°-75° relative to the substantially planar base portion. The color conversion film includes a material having a refractive index of about 1.5-1.7.

In an embodiment, the substantially planar base portion has a thickness of up to about 15 μm.

In an embodiment, the material of the color conversion film includes phosphor material. In an embodiment, the material includes quantum dots.

In an embodiment, each of the plurality of three-dimensional structures has a shape selected from the group consisting of a pyramid and a cone.

According to an aspect of the invention, there is provided a back light unit that includes an array of blue light emitting diodes, a first substrate constructed and arranged to diffuse light emitted from the array of light emitting diodes, and a color conversion layer. The color conversion layer includes a base portion with a first side in contact with the first substrate and a second side opposite the first side. The color conversion layer includes a plurality of three-dimensional structures extending from the second side of the base portion. Each of the three-dimensional structures has at least one sloped surface with a base angle of about 55°-75°. The color conversion layer has a refractive index of about 1.5-1.7. The back light unit also includes a second substrate in contact with the plurality of three-dimensional structures. The second substrate has a refractive index of about 0.05 to about 0.3 less than the refractive index of the color conversion layer.

In an embodiment, the base portion has a thickness of up to about 15 μm.

In an embodiment, the color conversion layer has a refractive index of 1.6, and the second substrate has a refractive index of 1.5. In an embodiment, the base angle is about 70°.

In an embodiment, the color conversion layer has a refractive index of 1.7, and the second substrate has a refractive index of 1.5. In an embodiment, the base angle is about 60°.

In an embodiment, a difference between refractive indices of the color conversion layer and the second substrate is 0.1, and the base angle is about 70°.

In an embodiment, a difference between refractive indices of the color conversion layer and the second substrate is 0.2, and the base angle is about 60°.

In an embodiment, the color conversion layer includes phosphor material. In an embodiment, color conversion layer includes quantum dots.

These and other aspects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

The components of the following figures are illustrated to emphasize the general principles of the present disclosure and are not necessarily drawn to scale, although at least one of the figures may be drawn to scale. Reference characters designating corresponding components are repeated as necessary throughout the figures for the sake of consistency and clarity.

FIG. 4 is a schematic illustration of a portion of a color conversion layer of the back light unit illustrated in FIG. 3.

DETAILED DESCRIPTION

Figure 1:
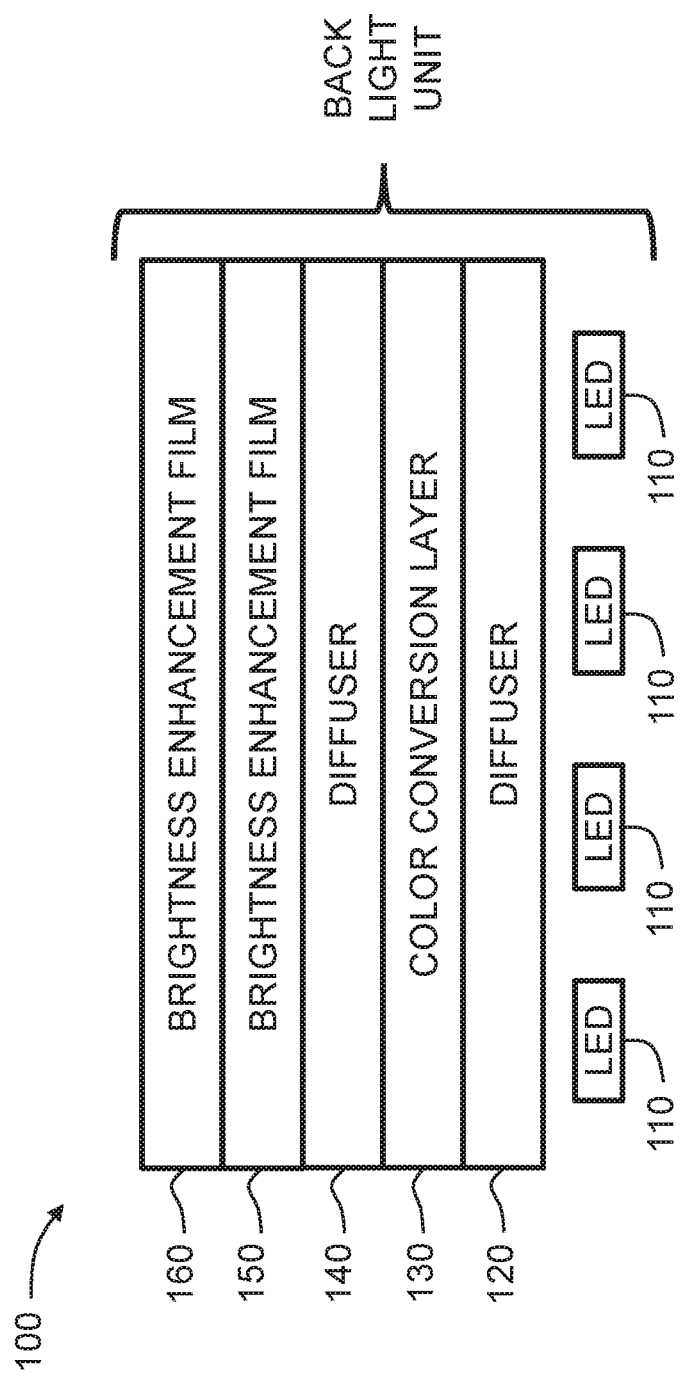
FIG. 1 is a schematic illustration of a back light unit for an LCD display.
Figure 2:
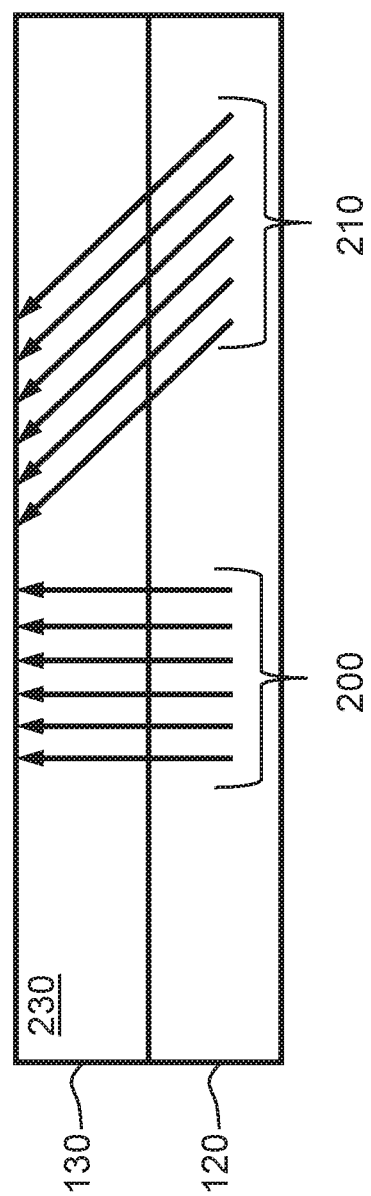
FIG. 2 is a schematic illustration of a portion of the back light unit of FIG. 1.
Figure 3:
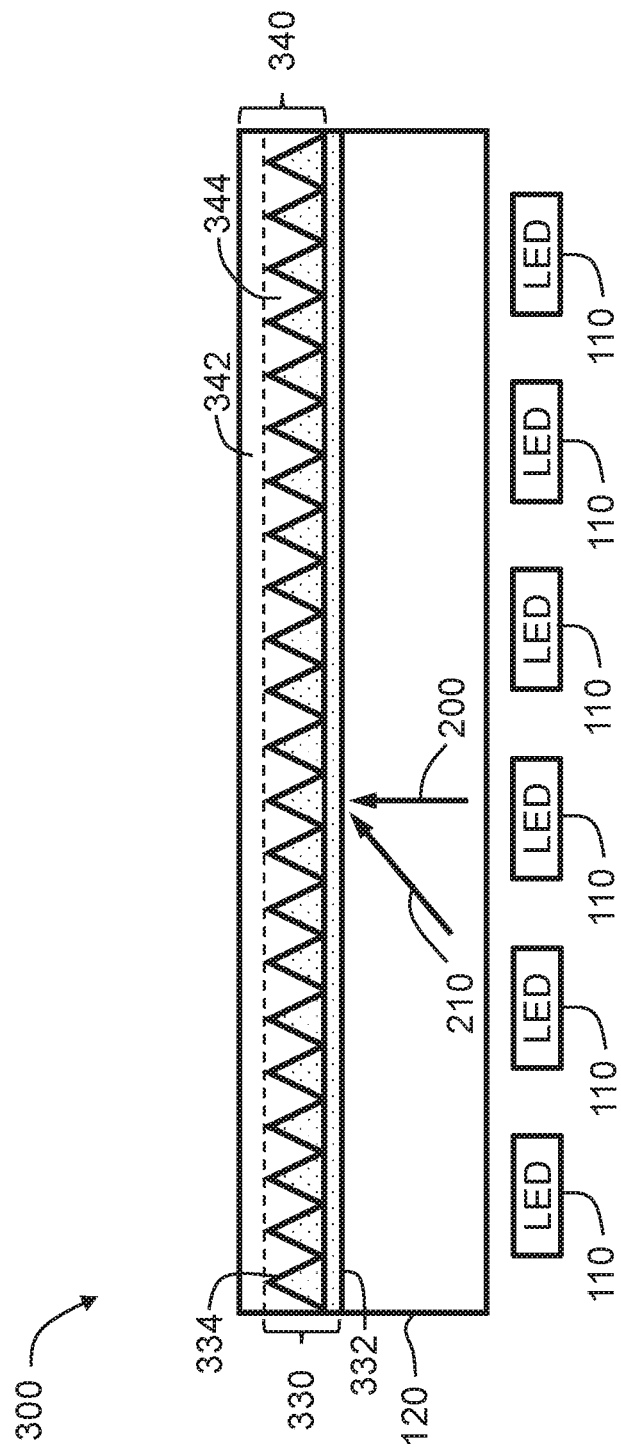
FIG. 3 is a schematic illustration of a portion of the back light unit according to an embodiment of the invention.

FIG. 3 schematically illustrates a portion of a back light unit 300 according to embodiments of the present invention. The illustrated portion of the back light unit 300 includes a color conversion layer 330 that includes a substantially planar base portion 332 having a first side in contact with the diffuser film 120, and a plurality of three-dimensional structures 334 extending from a second side of the substantially planar base portion 332 opposite the first side. The color conversion layer 330 may include material that is typically used for color conversion of blue light from an LED light source, such as phosphors or quantum dots, or the color conversion layer 330 may include some other material that can perform the same function as phosphors and quantum dots. In an embodiment, the color conversion layer 330 includes phosphor particles having an equivalent diameter in the range of about 4 µm-25 µm.

As also illustrated in FIG. 3, a substrate 340 contacts the three-dimensional structures 334 of the color conversion layer 330. The substrate 340 includes a base portion 342 that is positioned above the peaks of the three-dimensional structures 334 of the color conversion layer 330, and a plurality of three-dimensional structures 344 that extend from the base portion 342 and fill in the voids between the three-dimensional structures 334 of the color conversion layer 33 so that the three-dimensional structures 334 of the color conversion layer 330 are encapsulated by the substrate 340.

FIG. 4 is an enlarged view of three of the three-dimensional structures 334 that are adjacent to each other. As illustrated, each of the plurality of three-dimensional structures 334 has at least one sloped surface at an angle θ relative to the substantially planar base portion 332. In an embodiment, the three-dimensional structure 334 may be in the form of a four-side pyramid, a three-sided pyramid (tri-pyramid) or a cone. In an embodiment, the peaks of the three-dimensional structures may be truncated, rounded, or have other minor variations in shape. The illustrated embodiment is not intended to be limiting in any way.

The bases of the three-dimensional structures 334 desirably cover the majority, if not all, of the base portion 332, i.e., the three-dimensional structures 334 are tiled closely together. In an embodiment, the widths of the bases of the three-dimensional structures 334 may be in the range of about 30 µm to about 75 µm. The slopes of the side walls of the three-dimensional structures 334 should generally have relatively high angles, as represented by the angle θ in FIG. 4. As discussed in further detail below, it has been found that the lower the refractive index difference between the color converting layer 330 and the surrounding material, such as the substrate 340 in FIG. 3, the greater the angle θ.

For example, if the color conversion layer 330 contains a phosphor material and has a refractive index (n) of 1.6, and the material in contact with the steep sides of the three-dimensional structures 334 has a refractive index (n) of 1.5, then the slopes of the sides of the structures 334, represented by angle θ, should be ~70 degrees relative to the base portion 332. This allows for the light rays that are almost normal (~90 degrees), represented by arrow 200, to be guided by total internal reflection (TIR), whereas the low angle light rays, represented by arrow 210, will not be guided, which has the potential of equalizing the distances that each of the types of light rays 200, 210 travel in the color conversion material before exiting the color conversion layer 330 as light rays represented by arrows 400 and 410, respectively, in FIG. 4. By guiding the light rays 200, 210 coming in at different angles in a manner such that the light rays have similar path-lengths to exit the color conversion layer 330, it is expected the light rays 200, 210 will be absorbed to a similar degree by the color conversion layer 330 and the uniformity of the light exiting the color conversion layer 330 will be improved.

The design of the three-dimensional structures 334 that equalize the relative absorptions of the blue light with different incident angles depends on the refractive index of the various materials in the adjacent layers, and also the thickness of the base portion 332 that includes a phosphor material or quantum dots, which in some embodiments may be optional. As understood by one of ordinary skill in the art, the thickness of the base portion 332 of the color conversional layer 330 with depend on, in part, the size and concentration of the phosphor particles or quantum dots in the material used for the color conversion layer 330, for example a lower concentration of color changing material would require larger structures to compensate Modelled Performance A variety of structures for the color conversion layer 330 were modelled to predict the absorption properties of the color conversion layer 330 with respect to blue light entering the color conversion layer 330 at different angles, which were grouped at 85°-90°, 80°-90°, 65°-70°, 50°-55°, and 42.5°-47.5°. An absorption value of 1.0 means the light is expected to be fully absorbed by the color conversion layer 330, and an absorption value of 0.0 means the light is not expected to be absorbed at all by the color conversion layer 330. Two different embedded phosphor structures with phosphor material having a refractive index of n=1.6 and n=1.7, and a surrounding material of n=1.5 were used, as well as two different base portion 332 thicknesses of 5 µm and 15 µm. A control having no three-dimensional structures was also modelled across the various incoming ray angles. The results of the modelling are listed in Tables I-IV below.

For the first set of data, the thickness of the base portion 332 of the color conversion layer 330 was set to 5 µm, the refractive index of the phosphor material in the color conversion layer 330 was set to 1.7, and the cladding material in the layer 340 above the three-dimensional structures 334 was set to 1.5 so that the difference (Δ) between the refractive indices was 0.2. The three-dimensional structures 334 were in the shapes of a four-sided pyramid ('Pyramid"), a three-sided pyramid ("Tri-pyramid"), and a cone ("Cone"). The base taper angle θ was input at 45°, 60° and 70°. The results showing the effect of the shape of the three-dimensional structures 334, as well as the base taper angle θ of the three-dimensional structures 334 are listed in Table I.

TABLE I

Predicted Absorption of Blue Light Rays by Color Conversion Layer with 5 µm Base Portion and Refractive Index Δ of 0.2

| Shape of Structure | Taper Angle θ (°) | 85°-90° Incoming Rays | 80°-90° Incoming Rays | 65°-70° Incoming Rays | 50°-55° Incoming Rays | 42.5°-47.5° Incoming Rays | Ratio 45°/90° |
|---|---|---|---|---|---|---|---|
| None | NA | 0.18 | 0.18 | 0.19 | 0.21 | 0.22 | 1.25 |
| Pyramid | 45 | 0.43 | 0.43 | 0.52 | 0.56 | 0.53 | 1.33 |
| Pyramid | 60 | 0.67 | 0.69 | 0.65 | 0.64 | 0.65 | 0.97 |
| Pyramid | 70 | 0.94 | 0.94 | 0.76 | 0.72 | 0.75 | 0.80 |
| Tri-pyramid | 60 | 0.38 | 0.40 | 0.46 | 0.46 | 0.48 | 1.27 |
| Tri-pyramid | 70 | 0.63 | 0.61 | 0.55 | 0.53 | 0.55 | 0.88 |
| Cone | 60 | 0.65 | 0.66 | 0.65 | 0.66 | 0.67 | 1.03 |
| Cone | 70 | 0.97 | 0.97 | 0.77 | 0.45 | 0.77 | 0.85 |

The modelling results listed in Table I show the effect of the angle of the incoming light rays on the absorption by the color conversion layer 330. For the color conversion layer with no three-dimensional structures, there is more absorption at lower angles of incidence (i.e. near normal). The results also indicate that a color conversion layer 330 with three-dimensional structures 334 in the shape of a pyramid or cone, and a base taper angle θ of ~60° are predicted to equalize the relative absorption of high angle and low angle rays of incoming blue light to a desired level. In other words, the structures in the shape of a pyramid or cone and a base taper angle θ of ~60° should have the most consistent absorption of the incoming blue light across angles of incidence, which is desirable.

For the next set of data, the thickness of the base portion 332 of the color conversion layer 330 was increased to 15 µm. The refractive index of the material in the color conversion layer 330 was kept at 1.7, and the cladding material in the layer 340 above the three-dimensional structures 334 was kept at 1.5 (Δ=0.2). The results showing the effect of the shape of the three-dimensional structures 334, as well as the base taper angle θ of the three-dimensional structures 334 are listed in Table II.

TABLE II

Predicted Absorption of Blue Light Rays by Color Conversion Layer with 15 µm Base Portion and Refractive Index Δ of 0.2

| Shape of Structure | Taper Angle θ (°) | 85°-90° Incoming Rays | 80°-90° Incoming Rays | 65°-70° Incoming Rays | 50°-55° Incoming Rays | 42.5°-47.5° Incoming Rays | Ratio 45°/90° |
|---|---|---|---|---|---|---|---|
| None | NA | 0.44 | 0.44 | 0.46 | 0.50 | 0.52 | 1.19 |
| Pyramid | 45 | 0.61 | 0.61 | 0.68 | 0.72 | 0.74 | 1.21 |
| Pyramid | 60 | 0.77 | 0.78 | 0.77 | 0.77 | 0.78 | 1.02 |
| Pyramid | 70 | 0.96 | 0.96 | 0.84 | 0.82 | 0.85 | 0.88 |
| Tri-pyramid | 60 | 0.57 | 0.59 | 0.64 | 0.66 | 0.68 | 1.18 |
| Tri-pyramid | 70 | 0.75 | 0.73 | 0.70 | 0.70 | 0.72 | 0.97 |
| Cone | 60 | 0.76 | 0.77 | 0.76 | 0.78 | 0.80 | 1.05 |
| Cone | 70 | 0.94 | 0.94 | 0.85 | 0.84 | 0.86 | 0.91 |

The modelling results listed in Table II indicate that a color conversion layer 330 with three-dimensional structures 334 in the shape of a pyramid or cone, and a base taper angle θ of ~60°, as well as a tri-pyramid with a base angle of θ of ~70°, are predicted to equalize the relative absorption of high angle and low angle rays of incoming blue light to a desirable level.

For the next set of data, the thickness of the base portion 332 of the color conversion layer 330 was set to 5 μm, the refractive index of the material in the color conversion layer 330 was decreased to 1.6, and the cladding material in the layer 340 above the three-dimensional structures 334 was kept at 1.5 so that the difference (Δ) between the refractive indices was 0.1. The results showing the effect of the shape of the structures, as well as the base taper angle θ of the three-dimensional structures 334 are listed in Table III.

TABLE III

Predicted Absorption of Blue Light Rays by Color Conversion Layer with 5 μm Base Portion and Refractive Index Δ of 0.1

| Shape of Structure | Taper Angle θ (°) | 85°-90° Incoming Rays | 80°-90° Incoming Rays | 65°-70° Incoming Rays | 50°-55° Incoming Rays | 42.5°-47.5° Incoming Rays | Ratio 45°/90° |
|---|---|---|---|---|---|---|---|
| None | NA | 0.18 | 0.18 | 0.19 | 0.21 | 0.23 | 1.29 |
| Pyramid | 45 | 0.42 | 0.43 | 0.44 | 0.52 | 0.55 | 1.28 |
| Pyramid | 60 | 0.54 | 0.55 | 0.61 | 0.62 | 0.65 | 1.20 |
| Pyramid | 70 | 0.83 | 0.79 | 0.71 | 0.73 | 0.77 | 0.93 |
| Tri-pyramid | 60 | 0.36 | 0.36 | 0.41 | 0.44 | 0.46 | 1.28 |
| Tri-pyramid | 70 | 0.50 | 0.51 | 0.50 | 0.51 | 0.55 | 1.10 |
| Cone | 60 | 0.54 | 0.55 | 0.61 | 0.63 | 0.66 | 1.21 |
| Cone | 70 | 0.81 | 0.79 | 0.72 | 0.74 | 0.78 | 0.95 |

The modelling results listed in Table III indicate that a color conversion layer 330 with three-dimensional structures 334 in the shape of a pyramid or cone, and a base taper angle θ of ~70° are predicted to equalize the relative absorption of high angle and low angle rays of incoming blue light to a desirable level.

For the next set of data, the thickness of the base portion 332 of the color conversion layer 330 was increased back to 15 μm, the refractive index of the material in the color conversion layer 330 was kept at 1.6, and the cladding material in the layer 340 above the three-dimensional structures 334 was kept at 1.5 (Δ=0.1). The results showing the effect of the shape of the three-dimensional structures 334, as well as the base taper angle θ of the three-dimensional structures 334 are listed in Table IV.

TABLE IV

Predicted Absorption of Blue Light Rays by Color Conversion Layer with 15 μm Base Portion and Refractive Index Δ of 0.1

| Shape of Structure | Taper Angle θ (°) | 85°-90° Incoming Rays | 80°-90° Incoming Rays | 65°-70° Incoming Rays | 50°-55° Incoming Rays | 42.5°-47.5° Incoming Rays | Ratio 45°/90° |
|---|---|---|---|---|---|---|---|
| None | NA | 0.44 | 0.44 | 0.46 | 0.51 | 0.54 | 1.22 |
| Pyramid | 45 | 0.61 | 0.61 | 0.63 | 0.70 | 0.72 | 1.20 |
| Pyramid | 60 | 0.68 | 0.69 | 0.74 | 0.76 | 0.79 | 1.15 |
| Pyramid | 70 | 0.88 | 0.86 | 0.80 | 0.83 | 0.86 | 0.97 |
| Tri-pyramid | 60 | 0.56 | 0.56 | 0.61 | 0.64 | 0.67 | 1.20 |
| Tri-pyramid | 70 | 0.65 | 0.66 | 0.67 | 0.69 | 0.73 | 1.11 |
| Cone | 60 | 0.69 | 0.69 | 0.74 | 0.77 | 0.79 | 1.16 |
| Cone | 70 | 0.87 | 0.85 | 0.81 | 0.83 | 0.86 | 0.99 |

The modelling results listed in Table IV indicate that a color conversion layer 330 with three-dimensional structures 334 in the shape of a pyramid or cone, and a base taper angle θ of ~70° are predicted to equalize the relative absorption of high angle and low angle rays of incoming blue light to a desirable level.

A review of all of the modelling results indicates that as the difference between the refractive indices of the color conversion layer 330 and the layer in direct contact with the three-dimensional structures 334 increases, the optimal base angles θ for the three-dimensional structures 334 should decrease to achieve the desired equalization of the relative absorption of the high angle and low angle rays of incoming blue light. In addition, increasing the thickness of the base portion 332 of the color conversion layer 330 generally increases the absorption of the blue light, as expected. By adjusting the relative thickness of the base portion 332, the shape of the three-dimensional structures 334, and the refractive index of the color conversion material of the color conversion layer 330 and of the material in the layer 340 in contact with the three-dimensional structures 334, it is possible to equalize the absorption of the low and high angle light rays, or in some cases to actually have higher absorption of the low angle or normal light.

The three-dimensional structures 334 of the color conversion layer 330 according to embodiments described herein may be created using many techniques known in the art. For example, in an embodiment, the shape of the three-dimensional structures 334 may be cast onto a substrate using a suitable master mold, and thermally-curing polymer or ultraviolet (UV) light curing polymer, or the shape may be impressed into a thermoplastic substrate through compression molding or other molding, or may be created at the same time as the substrate using extrusion-embossing or injection molding. The three-dimensional structures 334 may be produced by replicating a master. For example, an optical diffuser may be made by replication of a master containing the desired shapes as described in U.S. Pat. No. 7,190,387 B2 to Rinehart et al., entitled "Systems And Methods for Fabricating Optical Microstructures Using a Cylindrical Platform and a Rastered Radiation Beam"; U.S. Pat. No. 7,867,695 B2 to Freese et al., entitled "Methods for Mastering Microstructures Through a Substrate Using Negative Photoresist"; and/or U.S. Pat. No. 7,192,692 B2 to Wood et al., entitled "Methods for Fabricating Microstructures by Imaging a Radiation Sensitive Layer Sandwiched Between Outer Layers", assigned to the assignee of the present invention, the disclosures of all of which are incorporated herein by reference in their entireties as if set forth fully herein. The masters themselves may be fabricated using laser scanning techniques described in these patents, and may also be replicated to provide diffusers using replicating techniques described in these patents.

In an embodiment, the second substrate 340 may have its three-dimensional structures 344 created in the same manner described above with respect to the three-dimensional structures 334. The desired material(s) to be used for the color conversion layer 330 may then be applied to the three-dimensional structures 344 of the second substrate 340 and fill in the voids in between the three-dimensional structures 344 so that the color conversion layer 330 is formed with the three-dimensional structures 334 in between the three-dimensional structures 344.

Embodiments of the present invention mitigate the issues identified above caused by light coming into the color conversion layer at different angles by creating similar path-lengths through the color conversion layer, and as a result, similar absorptions. In order to achieve similar path lengths for high and low angle light, the color conversion layer includes three-dimensional structures containing, for example, phosphors or quantum dots, that guide the incoming low angle and normal light, and have a higher refractive index relative to the surrounding material. Each of the three-dimensional structures desirably has a wide base that faces the source of the blue light, and then a taper extended away from the source of the blue light, so that the three-dimensional structure has a decreasing cross-section as the light travels away from the light source.

The embodiments described herein represent a number of possible implementations and examples and are not intended to necessarily limit the present disclosure to any specific embodiments. Instead, various modifications can be made to these embodiments, and different combinations of various embodiments described herein may be used as part of the invention, even if not expressly described, as would be understood by one of ordinary skill in the art. Any such modifications are intended to be included within the spirit and scope of the present disclosure and protected by the following claims.

What is claimed is:

1. A color conversion film for a backlight unit comprising an array of light emitting diodes, the color conversion film comprising:
   a substantially planar base portion configured to receive light from a light source positioned below the substantially planar base portion; and
   a plurality of three-dimensional structures comprising a color conversion material and configured to extend from the substantially planar base portion in a direction away from the light source, each of the plurality of three-dimensional structures having at least one sloped surface at an angle Θ relative to the substantially planar base portion such that each of the plurality of three-dimensional structures comprises a decreasing cross-section as light travels away from the light source, wherein the angle Θ is chosen such that light rays entering the substantially planar base portion at different angles have similar path lengths to exit the plurality of three-dimensional structures, thereby equalizing an absorption of light for the light rays entering the substantially planar base portion at different angles.

2. The color conversion film according to claim 1, wherein the substantially planar base portion has a thickness of up to about 15 μm.

3. The color conversion film according to claim 1, wherein the color conversion film comprises a material having a refractive index in a range of about 1.5-1.7.

4. The color conversion film according to claim 1, wherein the color conversion material comprises phosphor material.

5. The color conversion film according to claim 1, wherein the color conversion material comprises a material having quantum dots.

6. The color conversion film according to claim 1, wherein each of the plurality of three-dimensional structures is cone shaped.

7. The color conversion film according to claim 6, wherein a peak of at least one of the plurality of three-dimensional structures is truncated and/or rounded.

8. The color conversion film according to claim 1, wherein each of the plurality of three-dimensional structures is pyramid shaped.

9. The color conversion film according to claim 8, wherein a peak of at least one of the plurality of three-dimensional structures is truncated and/or rounded.

10. The color conversion film according to claim 1, wherein bases of the plurality of three-dimensional structures cover a majority of the substantially planar base portion.

11. The color conversion film according to claim 1, wherein bases of the plurality of three-dimensional structures are tiled together.

12. The color conversion film according to claim 1, wherein the plurality of three-dimensional structures comprises bases having widths in the range of about 30 μm to about 75 μm.

13. The color conversion film according to claim 1, wherein the angle Θ comprises an angle between 55°-75°.

14. The color conversion film according to claim 1, wherein the angle Θ comprises an angle of nominally 60°.

15. The color conversion film according to claim 1, wherein the angle Θ comprises an angle of nominally 70°.

\* \* \* \* \*